United States Patent
Dewa et al.

(10) Patent No.: US 9,164,149 B2
(45) Date of Patent: Oct. 20, 2015

(54) TESTING DEVICE AND TESTING METHOD FOR QUANTUM BATTERY USING SEMICONDUCTOR PROBE

(75) Inventors: Harutada Dewa, Tokyo (JP); Kiyoyasu Hiwada, Tokyo (JP); Akira Nakazawa, Kobe (JP); Nobuaki Terakado, Kobe (JP)

(73) Assignees: Kabushiki Kaisha Nihon Micronics, Tokyo (JP); Guala Technology Co., Ltd., Kobe-shi (JP)

( * ) Notice: Subject to any disclaimer, the term of this patent is extended or adjusted under 35 U.S.C. 154(b) by 0 days.

(21) Appl. No.: 14/355,329

(22) PCT Filed: Oct. 30, 2011

(86) PCT No.: PCT/JP2011/075012
§ 371 (c)(1),
(2), (4) Date: Jul. 8, 2014

(87) PCT Pub. No.: WO2013/065094
PCT Pub. Date: May 10, 2013

(65) Prior Publication Data
US 2014/0320108 A1    Oct. 30, 2014

(51) Int. Cl.
*G01R 31/02* (2006.01)
*G01R 31/36* (2006.01)
(Continued)

(52) U.S. Cl.
CPC ............ *G01R 31/3637* (2013.01); *B82Y 10/00* (2013.01); *G01R 1/06744* (2013.01); *G01R 31/3641* (2013.01); *H01M 10/48* (2013.01); *G01R 31/3665* (2013.01)

(58) Field of Classification Search
CPC ........... G01R 31/3637; G01R 31/3641; G01R 31/3665; G01R 31/36; G01R 31/2889; G01R 31/3627; G01R 31/3682; G01R 11/04; G01R 19/155; G01R 19/145; G01R 1/06716; G01R 1/06722; G01R 1/06788; G01R 1/06777; G11B 9/1409; G11B 9/1418; G11B 9/14; G11B 9/02; G12B 21/02; G12B 21/08
USPC .................. 324/437, 72.5, 149, 446, 754.01, 324/755.01; 438/689, 52, 198, 56, 57, 59; 257/623, 684
See application file for complete search history.

(56) References Cited

U.S. PATENT DOCUMENTS 4,575,822 A * 3/1986 Quate ........................... 365/174
6,094,971 A * 8/2000 Edwards et al. ................ 73/105
(Continued)

FOREIGN PATENT DOCUMENTS

JP    A-6-275690    9/1994
JP    A-2000-19233    1/2000
(Continued)

OTHER PUBLICATIONS

Kajima, "Handotai Niji Denchi (Guera Battery) No Shinki Kaihatsu," [online], [retrieval date Oct. 28, 2011], Internet <URL:http//133.41.4.55/upload/83/riezon/2010/hp/a-2kajiyama>.
(Continued)

*Primary Examiner* — Tung X Nguyen
*Assistant Examiner* — Thang Le
(74) *Attorney, Agent, or Firm* — Oliff PLC

(57) ABSTRACT

This invention provide a testing device and method for a quantum battery by a semiconductor probe, whereby the electrical characteristics of the charging layer can be evaluated during the quantum battery manufacturing process. The testing device equipped with a semiconductor probe constituted by a conductive electrode and a metal oxide semiconductor layer including a metal oxide semiconductor which are laminated on a support, a source voltage for applying voltage across an electrode equipped to the semiconductor probe and a basic electrode laminated on a secondary battery charging layer, and an ammeter for measuring the current flowing between the electrode equipped on the semiconductor probe and the basic electrode of the secondary battery on which charging layer is laminated, and measures the current-voltage characteristics of the charging layer.

20 Claims, 12 Drawing Sheets

(51) Int. Cl.
  *H01M 10/48* (2006.01)
  *B82Y 10/00* (2011.01)
  *G01R 1/067* (2006.01)

(56) References Cited

U.S. PATENT DOCUMENTS

| | | | |
|---|---|---|---|
| 6,365,825 B1 * | 4/2002 | Hayashi et al. | 136/243 |
| 6,851,301 B2 * | 2/2005 | Kim et al. | 73/105 |
| 7,141,999 B2 | 11/2006 | Park et al. | |
| 7,442,571 B2 | 10/2008 | Park et al. | |
| 2005/0074973 A1 * | 4/2005 | Ouchi et al. | 438/689 |
| 2006/0023606 A1 * | 2/2006 | Lutwyche et al. | 369/100 |
| 2006/0076487 A1 | 4/2006 | Jung et al. | |
| 2007/0196618 A1 | 8/2007 | Nam et al. | |
| 2008/0138924 A1 | 6/2008 | Park et al. | |
| 2008/0169465 A1 | 7/2008 | Ko et al. | |
| 2009/0195961 A1 | 8/2009 | Eisenring | |
| 2013/0224596 A1 | 8/2013 | Nakazawa | |

FOREIGN PATENT DOCUMENTS

| | | |
|---|---|---|
| JP | A-2000-21455 | 1/2000 |
| JP | A-2001-267384 | 9/2001 |
| JP | A-2002-141062 | 5/2002 |
| JP | A-2005-524925 | 8/2005 |
| JP | A-2007-5279 | 1/2007 |
| WO | WO 2012/046325 A1 | 4/2012 |

OTHER PUBLICATIONS

International Search Report issued in International Patent Application No. PCT/JP2011/075012 dated Jan. 24, 2012.
Written Opinion issued in International Patent Application No. PCT/JP2011/075012 dated Jan. 24, 2012.
Lee et al., "Fabrication and Evaluation of Metal-Oxide Semiconductor Transistor Probe," 7th IEEE International Conference on Nanotechnology, Aug. 2-5, 2007, pp. 470-473.

* cited by examiner (A)

(B)

TESTING DEVICE AND TESTING METHOD FOR QUANTUM BATTERY USING SEMICONDUCTOR PROBE

TECHNICAL FIELD

The present invention relates to a testing device and a testing method for an all-solid-state battery based on a new operation principle in which an energy level is formed in a band gap using a photo-excited structural change of a metal oxide caused by irradiation of ultraviolet rays so as to trap electrons.

BACKGROUND ART

A nickel-hydrogen secondary battery is frequently mounted as a secondary battery used in an electric vehicle or a mobile device. In recent years, a lithium ion battery has been developed as a secondary battery capable of further increasing output and capacitance, and is about to be put into practical use.

In a lithium ion battery, a multiple metal oxide containing lithium is used as the positive electrode, a material capable of storing and releasing lithium such as carbon is used as the negative electrode, and the materials are impregnated with an electrolytic solution made up of a lithium salt capable of dissociating ions and an organic solvent capable of dissolving the lithium salt (refer to PTL 1 or the like).

Since the electrolytic solution is a liquid having a possibility of liquid leakage, and the use of a combustible material demands an improvement of the safety of the battery in case of erroneous use, an all-solid-state lithium secondary battery in which a solid electrolyte is used instead of the electrolytic solution also has been disclosed (refer to PTL 2 or the like).

Since lithium that is a rare metal is used, the cost of the lithium ion battery increases, and there is a demand for a secondary battery having an additional increase in performance and capacitance in terms of performance.

In consideration of the above-described circumstances, the present inventors propose an all-solid-state semiconductor battery capable of reducing the cost and performing stable operation using a simple configuration (hereinafter referred to as quantum battery) (PCT/JP2010-067643).

The quantum battery is configured by laminating a substrate, a conductive base electrode, a charging layer that forms an energy level in the band gap through a photo-excited structural change of an n-type metal oxide semiconductor coated with an insulating substance and traps electrons, a p-type semiconductor layer and a conductive opposite electrode. The charging layer is charged by connecting a power supply between the base electrode and the opposite electrode.

For the above-described quantum battery, evaluation is made on the current-voltage characteristics and the charging and discharging characteristics that are required to check functions in a manufacturing process thereof.

It is known that the current-voltage characteristics are generally used as a method for evaluating the characteristics of a semiconductor, but the current-voltage characteristics are also applied to the performance evaluation of a secondary battery.

For example, the current-voltage characteristics are applied to a method in which an internal resistance is detected based on the measured values of the voltage and current of a battery for a hybrid vehicle during discharging and charging, and the accurate current-voltage characteristics of the battery are assumed, thereby detecting an accurate internal resistance of the battery (refer to PTL 3 or the like) or a method in which the output range of a battery is divided into multiple ranges, a set number of sets of voltage and current are measured for each range, the current-voltage characteristics of the battery are specified based on the measured values, and the maximum output of the battery is computed on the basis of the current-voltage characteristics (refer to PTL 4 or the like).

In addition, during the manufacturing of a quantum battery, since the performance of a secondary battery relies on the charging layer, the quantum battery can be efficiently manufactured by evaluating the charging layer in the middle phase in which the charging layer has been laminated in the manufacturing process rather than by evaluating the charging layer after manufacturing a finished product.

Evaluating functions in the middle phase of the manufacturing process is means in a semiconductor field, and, for example, there is a measurement apparatus provided with an exposed source electrode for measurement and an exposed drain electrode for measurement between both sides of a gate electrode for measurement coated with an insulating film which is intended to directly measure the electrical characteristic of a semiconductor serving as an active layer without actually producing a field-effect thin film transistor.

When the respective exposed surfaces of the source electrode for measurement, the drain electrode for measurement and the insulating film therebetween are brought into contact with the surface of the semiconductor, coplanar pseudo field-electric thin film transistors are constituted of the contact portions. Then, it is possible to carry out the same measurement before the production of elements as in a case of an ordinary coplanar field-electric thin film transistor in which the elements have been produced (refer to PTL 5 or the like).

In addition, a method in which the current-voltage characteristics are accurately measured using a pseudo MOSFET when evaluating a SOI substrate, and values with favorable reproducibility are obtained with the influence of changes over time reduced to the minimum extent (refer to PTL 6 or the like) or a semiconductor probe for measurement (refer to PTL 7 or the like) have been also proposed.

CITATION LIST

Patent Literature

PTL 1: JP-A-2002-141062
PTL 2: JP-A-2007-5279
PTL 3: JP-A-2000-21455
PTL 4: JP-A-2000-19233
PTL 5: JP-A-06-275690
PTL 6: JP-A-2001-267384
PTL 7: JP-A-2005-524925

SUMMARY OF INVENTION

Technical Problem

However, since the quantum battery is an all-solid-state secondary battery based on a new principle, it is not possible to apply the method of the related art to evaluate a chip in the middle of a manufacturing process of the battery and to evaluate the charging and discharging characteristics or current-voltage characteristics as battery characteristics, and it is necessary to consider quantum battery-intrinsic structure and characteristics.

An object of the invention is to provide a testing device and a testing method for a quantum battery using a semiconductor probe which are capable of evaluating the electrical characteristics of a charging layer in the middle of a manufacturing process of the quantum battery.

Solution to Problem

The measurement subject of the invention is a quantum battery, and the quantum battery is configured by laminating a conductive base electrode, a charging layer that forms an energy level in a band gap through a photo-excited structural change of an n-type metal oxide semiconductor coated with an insulating substance and traps electrons, a p-type semiconductor layer and a conductive opposite electrode on a substrate. Furthermore, an n-type metal oxide semiconductor layer may be provided between the base electrode and the charging layer for a stable operation of the quantum battery.

To evaluate the electrical characteristics of the charging layer immediately after the charging layer is laminated for the quantum battery, a semiconductor probe is used to form a layer additionally laminated on the charging layer, and is brought into contact with the charging layer so as to measure the electrical characteristics, whereby the function of the charging layer in an ultimate finished product can be evaluated.

Therefore, the semiconductor probe is configured by laminating a conductive electrode and a metal oxide semiconductor layer made of a metal oxide semiconductor on a support.

In a case in which the measurement subject in production is provided with the conductive base electrode and the charging layer or the n-type metal oxide semiconductor layer and the charging layer on the conductive base electrode, the metal oxide semiconductor in the semiconductor probe is a p-type semiconductor, and is, for example, nickel oxide or copper aluminum oxide.

In addition, in a case in which the measurement subject in production is provided with the p-type metal oxide semiconductor layer and the charging layer on the conductive opposite electrode, the n-type metal oxide semiconductor layer may be provided on the conductive layer in the semiconductor probe. The n-type metal oxide semiconductor is, for example, titanium dioxide.

To trap electrons, the charging layer forms an energy level in the band gap through a photo-excited structural change caused by irradiating an ultraviolet ray on the n-type metal oxide semiconductor coated with an insulating substance.

When the support in the semiconductor probe is made of an elastic body or includes an elastic body section in a part, it is possible to control the contact pressure in a case in which the semiconductor probe is pressed perpendicularly to the charging layer, and to bring the semiconductor probe into contact with the charging layer with an appropriate pressure. Furthermore, the surface of the charging layer with which the semiconductor probe of the invention is brought into contact is a surface made up of fine particles, and, to bring the surface of the probe into close contact with the surface of the charging layer, it is necessary to provide flexibility to the surface of the probe in addition to the pressure. For example, an elastomer can be used as a material for the elastic body.

The electrode and the metal oxide semiconductor layer in a front end section of the semiconductor probe are evaluated in the electrical characteristics of the entire surface of the charging layer while being evaluated in the charging characteristics of each region on the surface of the charging layer with a larger area than the front end section of the semiconductor probe. Therefore, it is possible to evaluate the distribution or variation of the characteristics on the surface of the charging layer and to measure differences between the respective regions.

When the support in the semiconductor probe is made to be large enough to cover the entire surface of the charging layer, and is provided with a plurality of layers constituted of an independent electrode and an independent metal oxide semiconductor layer, it is possible to evaluate the distribution or variation of the electrical characteristics of the charging layer at the same time in a state in which the semiconductor probe is in contact with the layer formed of the independent electrode and the independent metal oxide semiconductor layer.

An electrical characteristic-testing device that evaluates the current-voltage characteristics of the charging layer using the above-described semiconductor probe is characterized by including
a semiconductor probe configured by laminating a conductive electrode and a metal oxide semiconductor layer made of a metal oxide semiconductor on a support, a source of voltage that applies voltage between the electrode provided in the semiconductor probe and a base electrode on which the charging layer for a secondary battery is laminated, and an ammeter that measures a current flowing between the electrode provided in the semiconductor probe and the base electrode on which the charging layer is laminated, and measuring the current-voltage characteristics of the charging layer.

An electrical characteristic-testing method that evaluates the current-voltage characteristics of the charging layer using the above-described semiconductor probe measures the current-voltage characteristics of the charging layer using a semiconductor probe configured by laminating a conductive electrode and a metal oxide semiconductor layer made of a metal oxide semiconductor on a support, a source of voltage that applies voltage between the electrode provided in the semiconductor probe and a base electrode on which the charging layer for a secondary battery is laminated, and an ammeter that measures a current flowing between the electrode provided in the semiconductor probe and the base electrode on which the charging layer is laminated.

A charging and discharging characteristic-testing device that evaluates the charging and discharging characteristics of the charging layer using the above-described semiconductor probe is characterized by including
a semiconductor probe configured by laminating a conductive electrode and a metal oxide semiconductor layer made of a metal oxide semiconductor on a support, a source of voltage that applies voltage between the electrode provided in the semiconductor probe and a base electrode on which the charging layer for a secondary battery is laminated so as to charge the charging layer, a load resistance connected in parallel to the source of voltage and a voltmeter that measures a voltage at the load resistance, and measuring the charging and discharging characteristics of the charging layer as battery characteristics by charging the charging layer, then, blocking the source of voltage so as to make a current from the charging layer flow into the load resistance, and measuring a voltage at the load resistance.

A charging and discharging characteristic-testing method that evaluates the charging and discharging characteristics of the charging layer using the above-described semiconductor probe is characterized by measuring the charging and discharging characteristics of the charging layer as battery characteristics by charging the charging layer, then, blocking the source of voltage so as to make a current from the charging layer flow into the load resistance, and measuring a voltage at the load resistance using a semiconductor probe configured by laminating a conductive electrode and a metal oxide semiconductor layer made of a metal oxide semiconductor on a support, a source of voltage that applies voltage between the electrode provided in the semiconductor probe and a base electrode on which the charging layer for a secondary battery is laminated so as to charge the charging layer, a load resistance connected in parallel to the source of voltage and a voltmeter that measures a voltage at the load resistance.

When it is possible to measure the current-voltage characteristics of the charging layer at a plurality of local regions at the same time, it is possible to learn the characteristic distribution, and it becomes easy to specify and restore abnormal places or poor places. To procure what has been described above, the following testing device and method are applied.

In the electrical characteristic-testing device of the charging layer using the semiconductor probe, when a plurality of the electrodes and the metal oxide semiconductor layers are formed on the support, it is possible to measure the current-voltage characteristics of the charging layer at a plurality of local regions at the same time.

In the electrical characteristic-testing method of the charging layer using the semiconductor probe, when a semiconductor probe in which a plurality of the electrodes and the metal oxide semiconductor layers are formed on the support is used, it is possible to measure the current-voltage characteristics of the charging layer at a plurality of local regions at the same time.

In the charging and discharging characteristic-testing device of the charging layer using the semiconductor probe, when a plurality of the electrodes and the metal oxide semiconductor layers are formed on the support, it is possible to measure the charging and discharging characteristics of the charging layer at a plurality of local regions.

In the charging and discharging characteristic-testing method of the charging layer using the semiconductor probe, when a semiconductor probe in which a plurality of the electrodes and the metal oxide semiconductor layers are formed on the support is used, it is possible to measure the charging and discharging characteristics of the charging layer at a plurality of local regions.

Advantageous Effects of Invention

According to the invention, in the quantum battery configured by laminating a conductive base electrode, a charging layer that forms an energy level in a band gap through a photo-excited structural change of an n-type metal oxide semiconductor coated with an insulating substance and traps electrons, a p-type semiconductor layer and a conductive opposite electrode on a substrate, it is possible to evaluate the electrical characteristics, that is, current-voltage characteristics and charging and discharging characteristics of the charging layer in the middle of the production process immediately after the lamination of the charging layer using the semiconductor probe provided with the electrode and the metal oxide semiconductor layer.

The use of an elastic body for the support in the semiconductor probe enables the uniform close contact between the surface of the semiconductor probe and the surface of the charging layer and the appropriate control of the contact pressure.

In addition, when the support in the semiconductor probe is made to be large enough to cover the entire surface of the charging layer, and is provided with a plurality of layers constituted of an independent electrode and an independent metal oxide semiconductor layer, it becomes possible to measure the distribution or variation of the characteristics of regions in the charging layer and to measure differences at the same time, and the effective learning of the characteristics and the specification and restoration of abnormal places or poor places become easy.

DESCRIPTION OF EMBODIMENTS

The invention is a testing device and a testing method for a quantum battery using a semiconductor probe that are applied to a quantum battery that is a secondary battery based on a new charging principle in which a photo-excitation structure-changing technique is employed for a charging layer, and, for the clearer understanding and description of the invention, the structure and principle of a quantum battery that is an application subject will be first described, and then an embodiment for carrying out the invention will be described.

Figure 1:
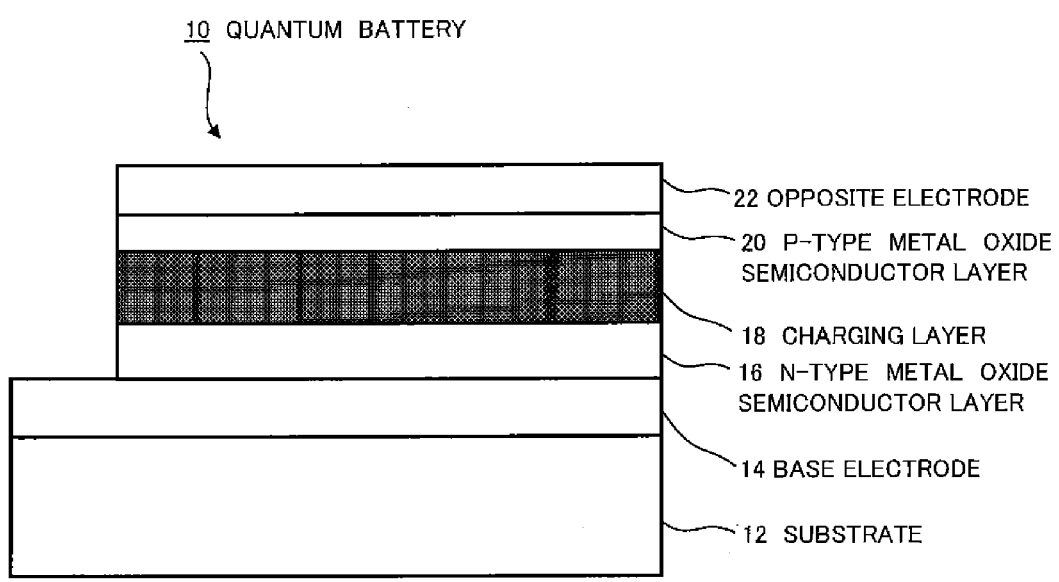
FIG. 1 is a view illustrating a configuration of a quantum battery to which a testing device and a testing method for a quantum battery using a semiconductor probe according to the invention are applied.

FIG. 1 is a view illustrating a cross-sectional structure of a quantum battery to which the invention is applied. In FIG. 1, in a quantum battery 10, a conductive base electrode 14 is formed on a substrate 12, and furthermore, an n-type metal oxide semiconductor layer 16, a charging layer 18 that charges energy, a p-type metal oxide semiconductor layer 20 and an opposite electrode 22 are laminated.

The substrate 12 may be made of an insulating substance or a conductive substance, and it is possible to use, for example, a resin sheet such as a glass substrate or a macromolecular film or a metal foil sheet.

A conductive film may be formed as the base electrode 14 and the opposite electrode 22, and the conductive film is, for example, a silver (Ag) alloy film containing aluminum (Al) as a metallic material, or the like. Examples of a method for forming the conductive film include gas-phase film-forming methods such as sputtering, ion plating, electronic beam deposition, vacuum deposition and chemical deposition. In addition, the base electrode 14 and the opposite electrode 22 can be formed using an electrolytic plating method, a non-electrolytic plating method or the like. Generally, as a metal used for the plating, it is possible to use copper, a copper alloy, nickel, aluminum, silver, gold, zinc, tin or the like.

As a material for the n-type metal oxide semiconductor layer 16, titanium dioxide ($TiO_2$), tin oxide ($SnO_2$) or zinc oxide (ZnO) is used.

Figure 2:
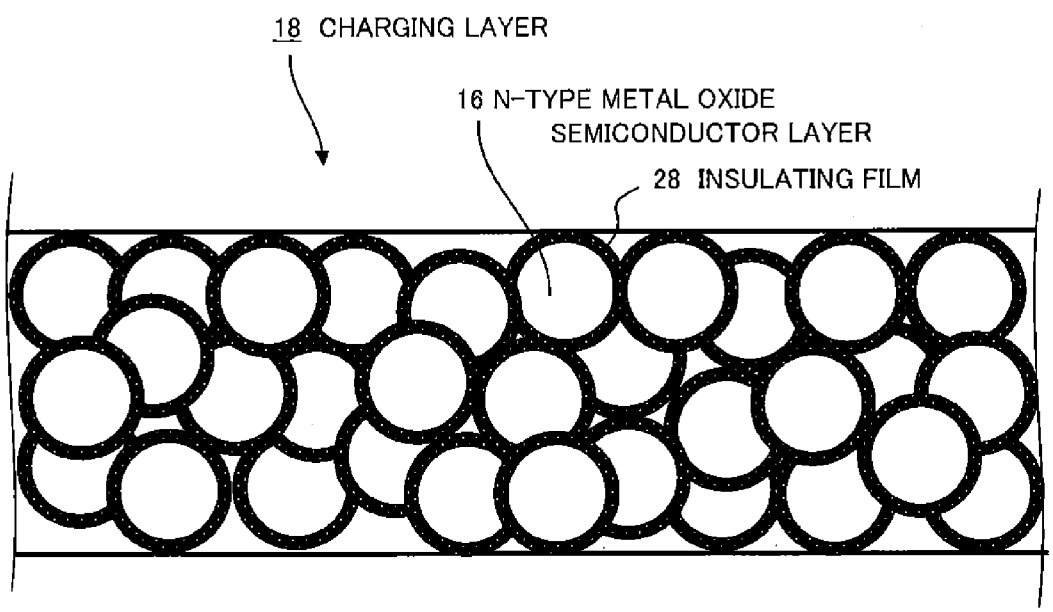
FIG. 2 is a view describing a charging layer in the quantum battery.

As illustrated in FIG. 2, the charging layer 18 is filled with fine particles of an n-type metal oxide semiconductor coated with an insulating film, and is provided with a charging function through a photo-excited structural change caused by the irradiation of ultraviolet rays. The n-type metal oxide semiconductor is coated with an insulating film such as silicone. As a material for the n-type metal oxide semiconductor that can be used in the charging layer 18, titanium dioxide, tin oxide ($SnO_2$) and zinc oxide (ZnO) are preferred, and a combination of titanium dioxide, tin oxide and zinc oxide may be used as the material.

The p-type metal oxide semiconductor formed on the charging layer 18 is provided to prevent the injection of electrons from the opposite electrode 22 located above. As a material for the p-type metal oxide semiconductor layer 20, nickel oxide (NiO), copper aluminum oxide ($CuAlO_2$) and the like can be used.

An insulating film of silicone is formed on titanium dioxide in the charging layer 18, but the insulating film is not always uniform and varies in thickness, and, in a case in which the variation is significant, there is a case in which the titanium oxide comes into direct contact with the electrode with no film formed on the titanium oxide. In such a case, electrons are injected into the titanium dioxide through recombination, the energy level is not formed in the band gap, and the charging capacitance decreases. Therefore, to suppress the decrease in the charging capacitance and to produce a higher-performance secondary battery, the n-type metal oxide semiconductor layer 16 is formed between the base electrode 14 and the charging layer 18 as illustrated in FIG. 1.

Figure 3:
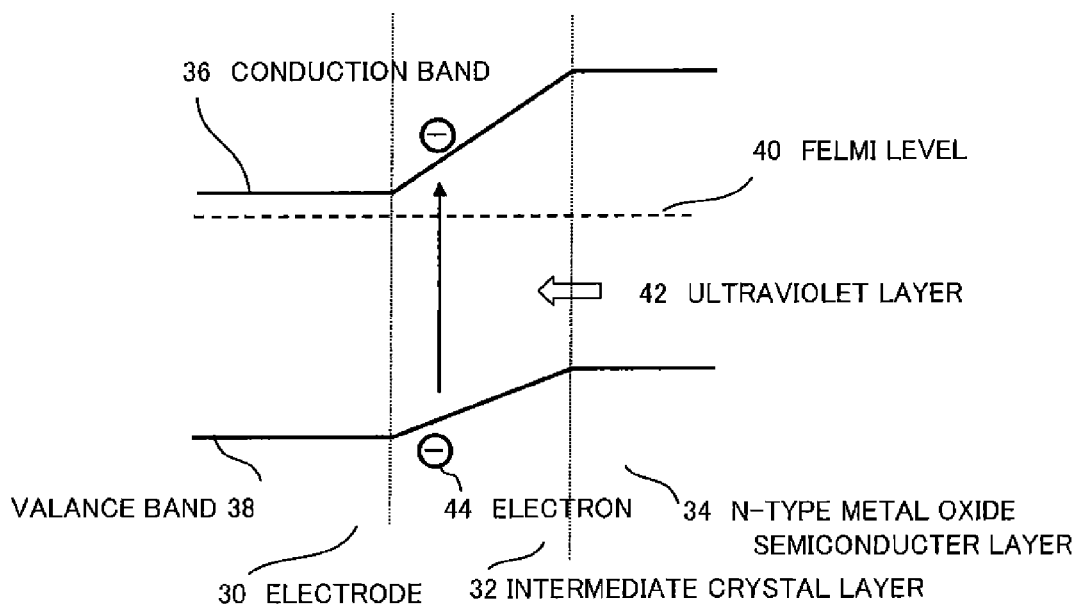
FIG. 3 is a band view describing a photo-excited structural change.
Figure 3:
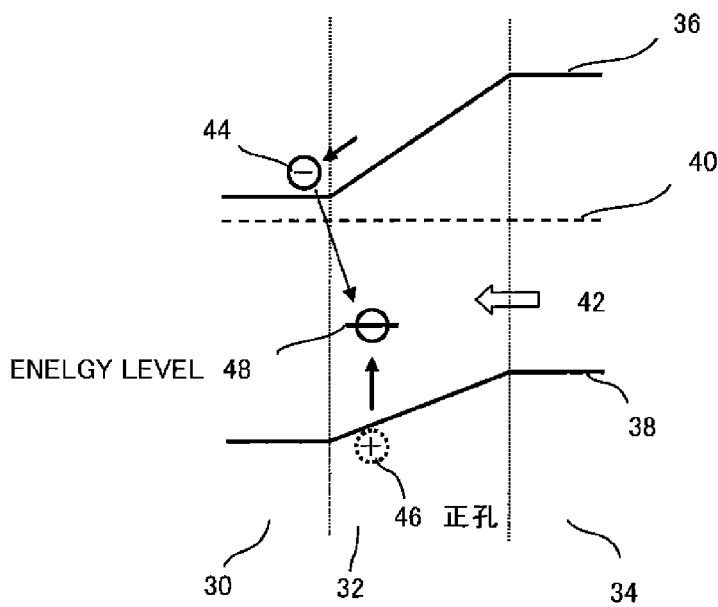

FIGS. 3(A) and 3(B) illustrate band views of a model structure for describing a basic phenomenon in which a new energy level is formed through a photo-excited structural change of the charging layer caused by the irradiation of ultraviolet rays.

The band view of FIG. 3(A) illustrates an electrode 30, an intermediate crystal layer 32 and an n-type metal oxide semiconductor layer 34. There is a Fermi level 40 between a conduction band 36 and a valence band 38, the Fermi level 40 of the electrode 30 is close to the conduction band 36, and the Fermi level 40 of the n-type metal oxide semiconductor layer 34 is present in the middle of the conduction band 36 and the valence band 38. When an ultraviolet ray 42 is irradiated, an electron 44 in the valence band 38 of the intermediate crystal layer 32 is excited to the conduction band 36.

In a state in which the ultraviolet ray is being irradiated as illustrated in FIG. 3(B), the electron 44 in the valence band 38 in the area of the intermediate crystal layer 32 is excited to the conduction band 36 by the irradiation of the ultraviolet ray 42, and the excited electrons 44 is stored in the conduction band 36 of the electrode 30 due to the slope of the conduction band 36. On the other hand, a hole 46 generated by the absence of the electron 44 remains in the valence band 38. In the intermediate crystal layer 32, there is a time difference between the excitation by the ultraviolet ray and the recombination, and the time difference causes the rearrangement of atoms. Therefore, the hole 46 remaining in the valence band 38 of the intermediate crystal layer 32 moves into the band gap, and a new energy level 48 is formed.

Figure 4:
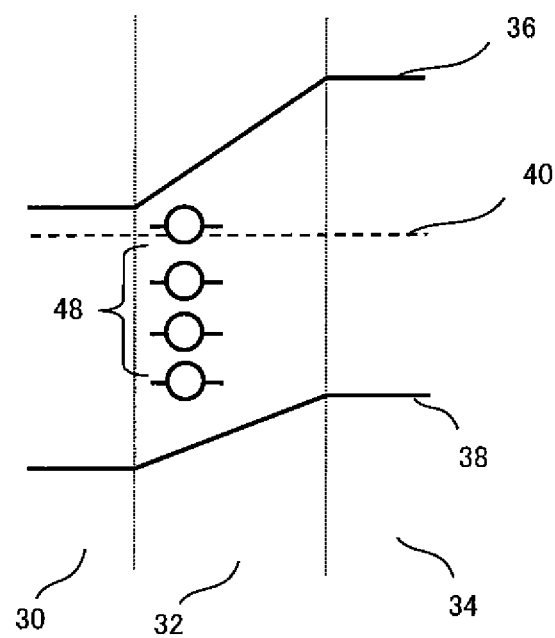
FIG. 4 is a band view describing a new energy level formed due to the photo-excited structural change.

FIG. 4 illustrates a state after the recombination in which the new energy levels 48 are formed in the band gap of the intermediate crystal layer 32 by the irradiation of the ultraviolet ray 42. An increase in the electron density in the band gap and the chemical shift of core electrons are observed only in the interface between the electrode 30 and the n-type metal oxide semiconductor layer 34, and it is considered that the atomic spacing has been also changed.

As described above, it has been described that the new energy levels 48 can be formed in the band gap by irradiating the ultraviolet ray 42 on the n-type metal oxide semiconductor layer 34, and the newly-formed energy levels 48 are used to serve as a secondary battery, and a charging function can be provided by forming a barrier using an insulating layer between the electrode and the n-type metal oxide semiconductor and controlling the electrons.

As described in FIGS. 1 and 2, the charging layer 18 illustrated in FIG. 1 is an n-type metal oxide semiconductor 26 made of a material of titanium dioxide on which an insulating film 28 of silicone is formed. In this case, a barrier formed of the insulating layer is provided between the titanium dioxide and the base electrode.

The quantum battery performs a battery function in a manner in which an electric field is formed in the energy level formed in the band gap when a voltage is applied from outside, thereby charging electrons, and a load is connected to the electrodes so as to release electrons, thereby extracting energy. The quantum battery can be used as a secondary battery through the repetition of the above-described phenomenon.

In a production process of the quantum battery, functional layers are sequentially laminated on the substrate, the function of the charging layer is most important, and, if it is possible to evaluate the charging layer immediately after being laminated even before the quantum battery is produced as a finished product, it is possible to cut defective products and to establish an efficient mass production process, and furthermore, the causes for abnormal places and poor qualities can be found, whereby the repair and management of a production facility become easy.

Figure 5:
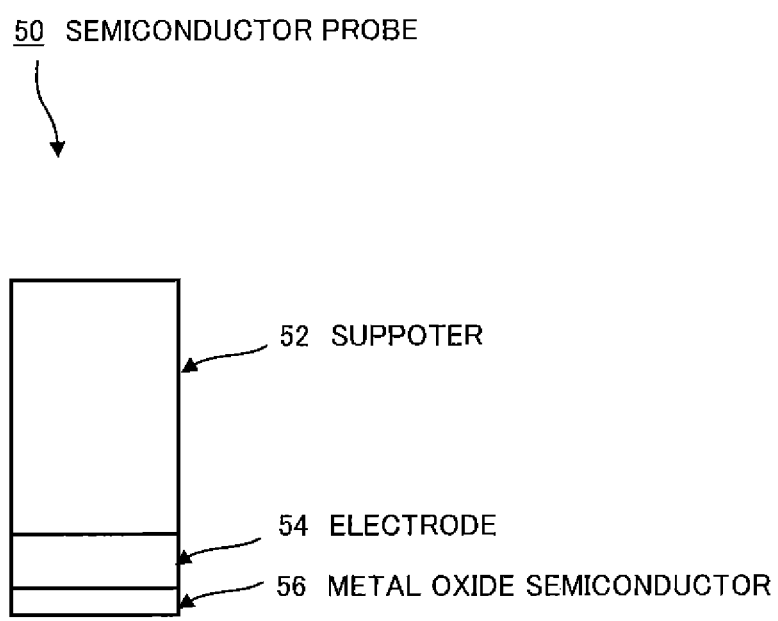
FIG. 5 is a view describing a semiconductor probe according to the invention.

FIG. 5 illustrates the semiconductor probe according to the invention that evaluates functions after the lamination of the charging layer in the production process of the quantum battery. Meanwhile, a state after the lamination of the charging layer refers to a state in which the charging layer has been laminated and a photo-excited structural change has been excited in the n-type metal oxide semiconductor in the charging layer by irradiating ultraviolet rays.

In FIG. 5, in a semiconductor probe 50, an electrode 54 made of a conductive metal and a metal oxide semiconductor 56 are laminated on a support 52 that is an insulating substance. The functional layers in the quantum battery 10 illustrated in FIG. 1 after the lamination of the charging layer 18 are provided to the semiconductor probe 50, and the semiconductor probe 50 is brought into close contact with the quantum battery 10 in production in which the charging layer 18 has been laminated so as to be perpendicular to the charging layer 18. Then, it is possible to make the quantum battery operate as a quantum battery and to evaluate the charging layer.

The electrode 54 in the semiconductor probe 50 for evaluation testing is simply required to provide conductivity, and is not necessarily made of the same material or as thick as the target quantum battery 10, and a metal sheet, a plated sheet, a conductive resin or the like can be used.

On the other hand, the metal oxide semiconductor 56 is not limited, but is preferably made of the same material and as thick as the target quantum battery 10. This is to further improve the evaluation accuracy of the electrical characteristics with respect to the charging layer 18.

A material for the metal oxide semiconductor 56 varies depending on the lamination order of the functional layers in the quantum battery 10 that is a subject to be measured. In a state in which the n-type metal oxide semiconductor layer 16 and the charging layer 18 are laminated on the substrate 12 in the quantum battery 10 illustrated in FIG. 1, since the p-type metal oxide semiconductor layer 20 and the opposite electrode 22 are laminated on the charging layer, the metal oxide semiconductor 56 in the semiconductor probe 50 is a p-type metal oxide semiconductor, and is made of the same material and as thick as the target quantum battery 10.

In the quantum battery 10, the functional layers are not necessarily laminated in the order as illustrated in FIG. 1, and the lamination order on the substrate 12 may be the opposite electrode 22, the p-type metal oxide semiconductor layer 20, the charging layer 18, the n-type metal oxide semiconductor layer 16 and the base electrode 14. In this case, in the semiconductor probe 50 used in evaluation after the lamination of the charging layer 18, the metal oxide semiconductor 56 is an n-type metal oxide semiconductor.

The support 52 may have a convenient shape to handle the semiconductor probe 50, and is desirably made of an insulating material. In addition, it is also possible to provide the support 52 with a function for bringing a front end section of the semiconductor probe 50 into close contact with the charging layer, and, in this case, the support 52 is made of an elastic body and is used to press the semiconductor probe 50. The close contact between the semiconductor probe and the charging layer is further improved by controlling the contact pressure of the semiconductor probe 50 with the charging layer 18 using the elastic body and pressing the elastic body with an appropriate pressure. A specific example of a material for the elastomer is an elastomer, and a variety of elastomers can be used.

The reason for using an elastic body for the support 52 is to improve the close contact between the semiconductor probe 50 and the charging layer 18 using an appropriate contact pressure along the uneven surface of the charging layer 18 made of fine particles, and the support may be provided with a laminate structure of a solid and an elastic body by forming a part of the support 52 using the elastic body for such a purpose.

The front end shape of the semiconductor probe 50, more specifically, the shape of the lamination part of the electrode 54 and the metal oxide semiconductor 56 may be, for example, quadrilateral. The shape may be square or rectangular, and this is because, in a case in which the plane of the quantum battery 10 is quadrilateral, it is possible to cover the entire surface of the charging layer by locally evaluating the electrical characteristics in the charging layer 18 and carrying out measurements at a plurality of places. Therefore, it becomes easy to specify abnormal places or poor places. As a result, the area of the front end shape is preferably smaller to specify abnormal places or poor places with high accuracy.

Meanwhile, the front end shape is not limited to a quadrilateral shape, and may be a round, oval or triangular shape. The front end can be provided with a shape enabling efficient measurement in accordance with the shape of the quantum battery that is a subject to be measured.

To measure a plurality of places in the charging layer 18 at the same time, it is possible to provide a plurality of laminate sections of the electrode 54 and the metal oxide semiconductor 56 to the support 52.

Figure 6:
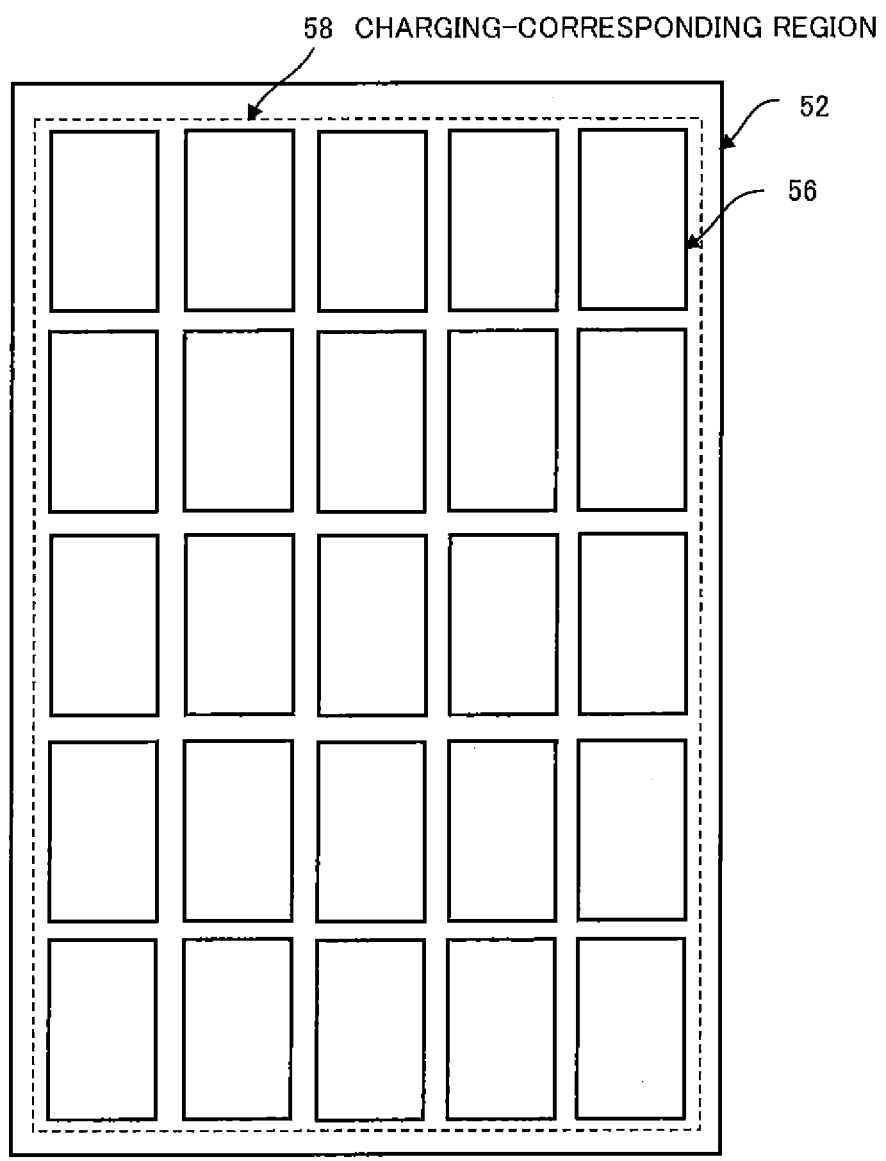
FIG. 6 is a front view of a front end of an example of the semiconductor probe having a plurality of laminates of an electrode and a metal oxide semiconductor provided on a support.

FIG. 6 is a view of a front end section of an example of the semiconductor probe 50 seen from the front in which 5×5 laminate sections of the electrode 54 and the metal oxide semiconductor 56 are arrayed in the vertical and horizontal directions of the support 52 respectively. The broken line in FIG. 6 indicates a charging-corresponding region 58 of the charging layer 18. As described above, when the semiconductor probe 50 illustrated in FIG. 6 is used, it is possible to measure the electrical characteristics at the same time in the partially-divided regions of the charging layer 18. Therefore, it is possible to measure the distribution or variation of the electrical characteristics, and furthermore, it is possible to measure the differences between the respective divided regions at the same time.

Meanwhile, in a case in which an n-type metal oxide semiconductor layer and a charging layer are provided on a conductive base electrode in a measurement subject in production, the metal oxide semiconductor in the semiconductor probe is a p-type semiconductor, and it is possible to bring the semiconductor probe into contact with the n-type metal oxide semiconductor layer so as to evaluate a PN junction as a diode characteristic, and to carry out the testing of the n-type metal oxide semiconductor layer before the charging layer is formed.

Similarly, in a case in which a p-type metal oxide semiconductor layer and a charging layer are provided on a conductive opposite electrode in a measurement subject in production, it is possible to bring the semiconductor probe provided with an n-type metal oxide semiconductor layer into contact with the p-type metal oxide semiconductor layer so as to evaluate a PN junction as a diode characteristic, and to carry out the testing of the p-type metal oxide semiconductor layer.

Next, a testing device measuring electrical characteristics in which the semiconductor probe according to the invention is used will be described.

Figure 7:
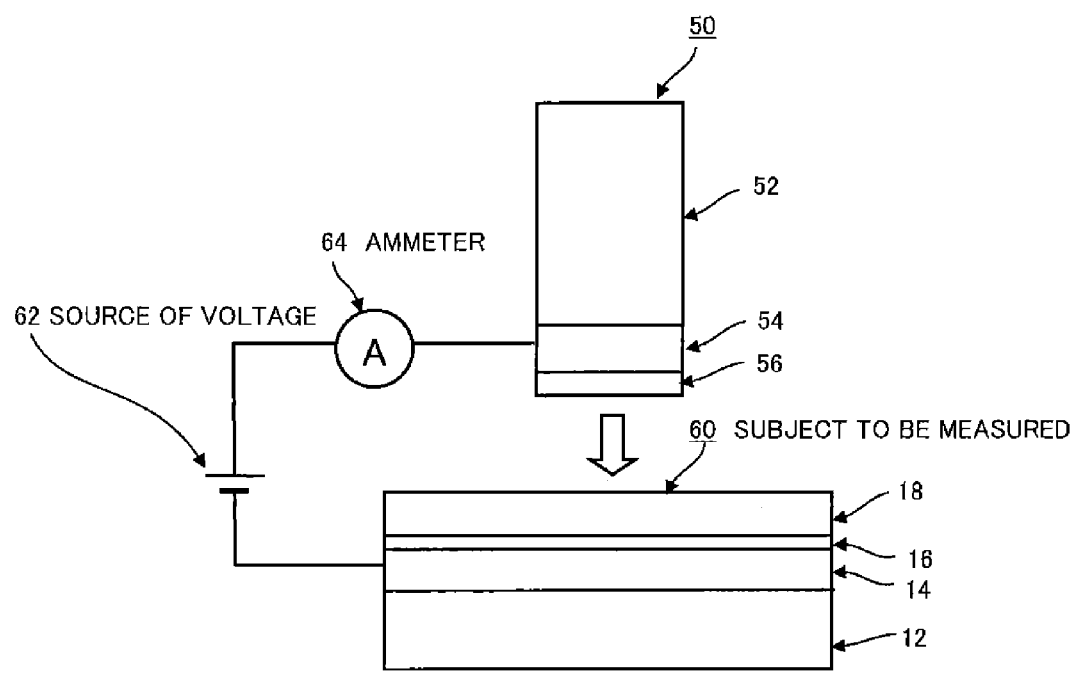
FIG. 7 is a schematic view of an electrical characteristic-testing device that evaluates the current-voltage characteristics of the charging layer using the semiconductor probe according to the invention.

FIG. 7 is a view illustrating the outline of an electrical characteristic-testing device that measures the current-voltage characteristics using the semiconductor probe according to the invention. In FIG. 7, a subject to be measured 60 is the quantum battery 10 in production in which the charging layer 18 has been laminated in the middle phase of the production process, the substrate 12, the base electrode 14, the n-type metal oxide semiconductor layer 16 and the charging layer 18 are laminated, and a photo-excited structural change occurs in the charging layer 18 by the irradiation of ultraviolet rays.

The semiconductor probe 50 is brought into contact with the subject to be measured 60 from the perpendicular direction, and the close contact is maintained with an appropriate pressure. Then, a state in which the functional layers in the quantum battery are all laminated is obtained.

To measure the current-voltage characteristics, a source of voltage 62 and an ammeter 64 are connected in series between the electrode 54 in the semiconductor probe 50 and the base electrode 14 in the subject to be measured 60. The voltage value of the source of voltage 62 can be controlled, and the current-voltage characteristics can be obtained by measuring the current value at the ammeter 64 with respect to the voltage value from the source of voltage 62.

Figure 8:
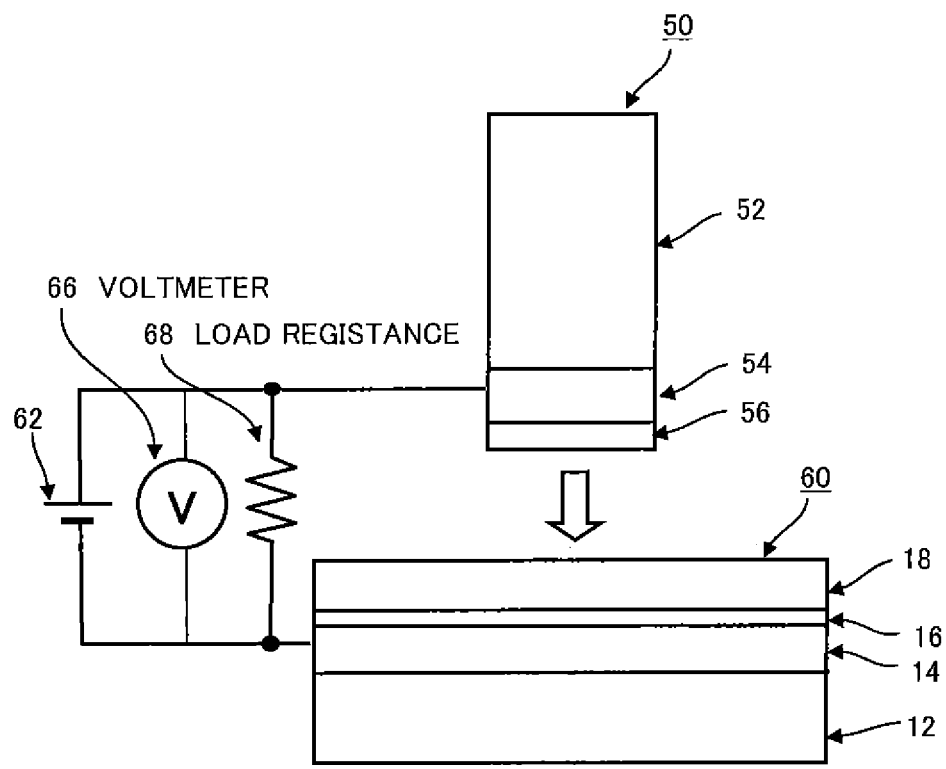
FIG. 8 is a schematic view of a charging and discharging characteristic-testing device that evaluates the charging and discharging characteristics of the charging layer using the semiconductor probe according to the invention.

FIG. 8 is a view illustrating the outline of a charging and discharging characteristic-testing device that measures the charging and discharging characteristics using the semiconductor probe according to the invention. In FIG. 8, the subject to be measured 60 is the quantum battery 10 in production in which the charging layer 18 has been laminated in the middle phase of the production process, the substrate 12, the base electrode 14, the n-type metal oxide semiconductor layer 16 and the charging layer 18 are laminated, and a photo-excited structural change occurs in the charging layer 18 by the irradiation of ultraviolet rays.

The semiconductor probe 50 is brought into contact with the subject to be measured 60 from the perpendicular direction, and the close contact is maintained with an appropriate pressure. Then, a state in which the functional layers in the quantum battery are all laminated is obtained.

To measure the charging and discharging characteristics, the source of voltage 62, the voltmeter 66 and the load resistance 68 are connected in parallel between the electrode 54 in the semiconductor probe 50 and the base electrode 14 in the subject to be measured 60. The voltage value of the source of voltage 62 can be controlled, a voltage applied to a load resistance 68 is measured using a voltmeter 66 by charging the charging layer 18 at a constant voltage and then blocking the source of voltage 62, and the charging and discharging characteristics are obtained from the voltage values over time.

Example 1

Figure 9:
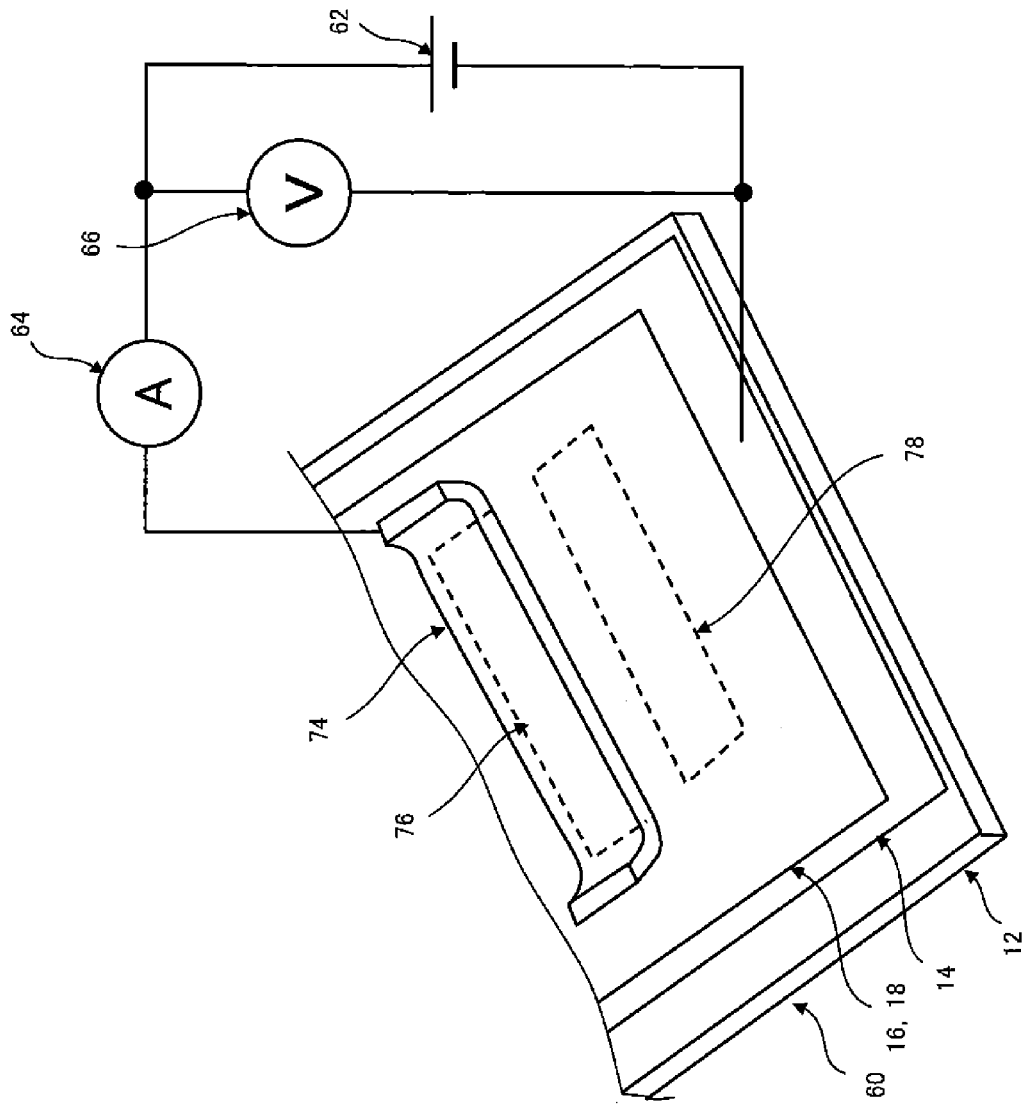
FIG. 9 illustrates an example in which the current-voltage characteristics of the charging layer are measured using the semiconductor probe.

FIG. 9 illustrates an example of a case in which an actually-prototyped subject to be measured 60 is measured using an electrical characteristic-testing device in which the semiconductor probe 50 of the invention is used. In the subject to be measured 60, a polyimide film was used as the substrate 12, a copper alloy was used as the base electrode 14, and titanium dioxide was used as the n-type metal oxide layer 16. In addition, the charging layer 18 is made of titanium dioxide fine particles coated with silicone.

An elastomer 74 was used as the support in the semiconductor probe 50, a copper alloy was used as the opposite electrode 54, and nickel oxide was used as the metal oxide semiconductor 56. The close contact between the semiconductor probe 50 and the surface of the charging layer 18 is improved using the elastomer 74. The lamination region of the opposite electrode 54 and the metal oxide 56 becomes a measurable measurement region 76. Furthermore, the electrical characteristics are measured in a charging layer measurement region 78 in the subject to be measured 60 which corresponds to the measurement region 76. The measurement region has a size of 8 mm×25 mm.

The source of voltage 62, the voltmeter 66 and the ammeter 64 for current measurement are connected to the electrode (not illustrated) provided in the elastomer 74 and the base electrode 14 in the subject to be measured 60. As illustrated in FIG. 9, the base electrode 14 is formed across a wider region than the charging layer 18 on a substrate surface 12 for wire connection. The source of voltage 62 is a variable voltage and can output voltage in a certain voltage range. The subject to be measured 60 is measured using the electric characteristic-testing device, thereby obtaining a relationship of a current with respect to voltage.

Figure 10:
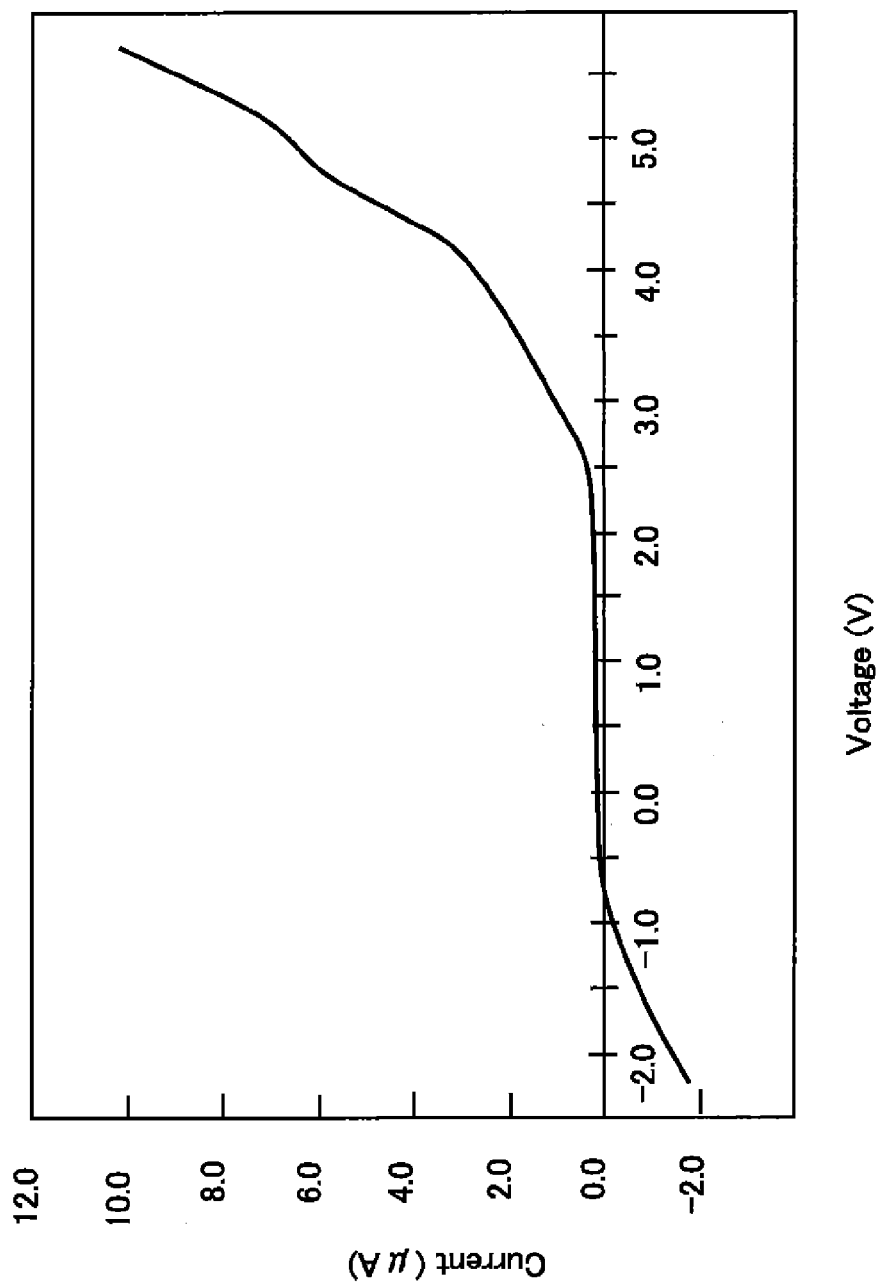
FIG. 10 is a view illustrating the measurement results of the current-voltage characteristics of the charging layer.

FIG. 10 illustrates the current-voltage characteristic-specified result illustrating the data of values in the ammeter 64 obtained while monitoring the voltage values of the source of voltage 62 using the voltmeter 66. The voltage value is varied in a range of −2 V to 6 V. The X axis indicates the voltage value (V) and the Y axis indicates the current value (μA). It was confirmed that the equivalent resistance was approximately 10 mega-ohms in the vicinity of 0 V to 1 V and the quantum battery operated in diode characteristics. Meanwhile, the diode characteristics were obtained even in a case in which the measurement region 76 in the semiconductor probe 50 was brought into direct contact with the electrode 14 in the subject to be measured 60 and the current-voltage characteristics were measured, and it could be confirmed that the semiconductor probe 50 performed the function.

Example 2

Figure 11:
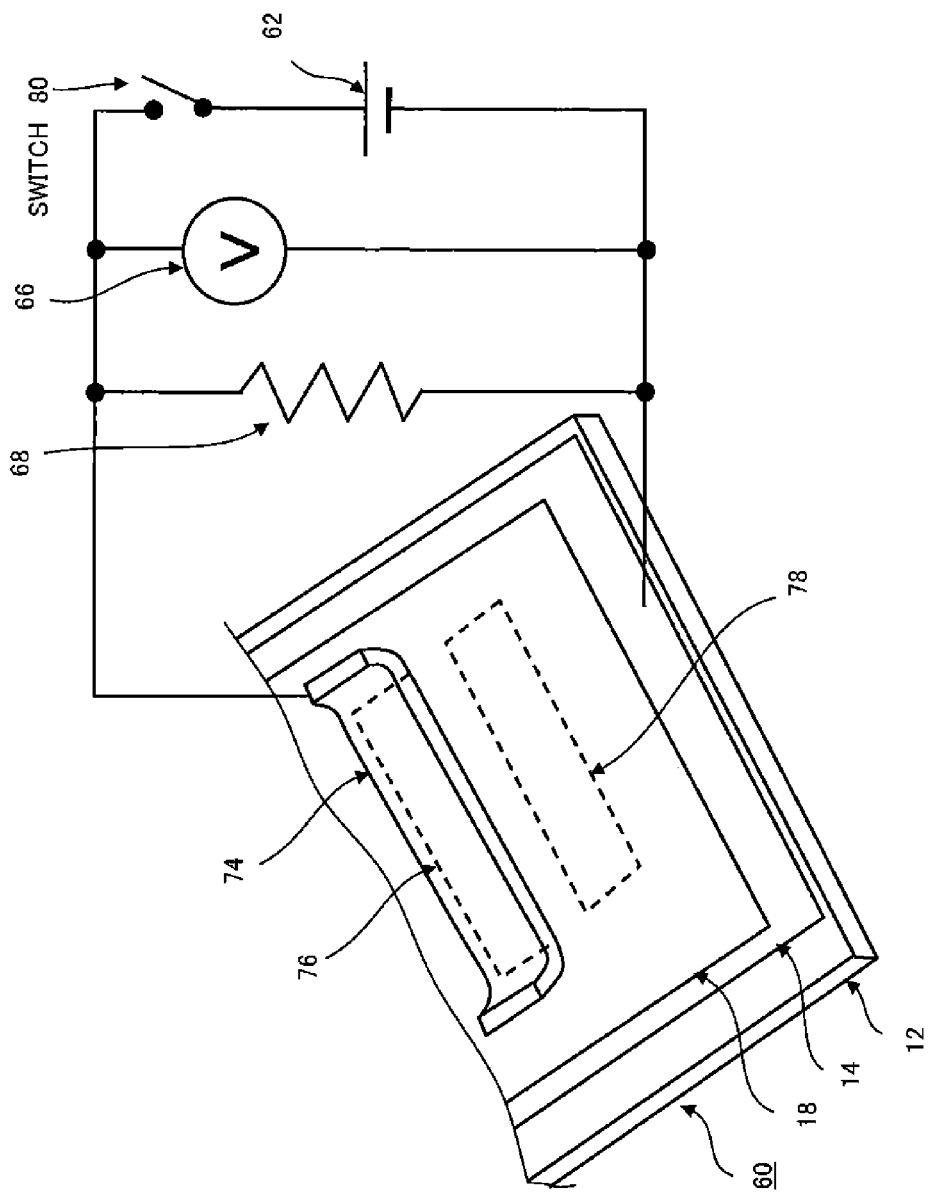
FIG. 11 illustrates an example in which the charging and discharging characteristics of the charging layer are measured using the semiconductor probe.

FIG. 11 illustrates an example of a case in which the actually-prototyped subject to be measured 60 is measured using a charging and discharging characteristic-testing device in which the semiconductor probe 50 of the invention is used. In the subject to be measured 60, a polyimide film was used as the substrate 12, a copper alloy was used as the base electrode 14, and titanium dioxide was used as the n-type metal oxide layer. In addition, the charging layer 18 is made of titanium dioxide fine particles coated with silicone.

The elastomer 74 was used as the support in the semiconductor probe 50, a copper alloy was used as the opposite electrode 54, and nickel oxide was used as the metal oxide semiconductor 56. The close contact between the semiconductor probe 50 and the surface of the charging layer 18 is improved using the elastomer 74. The lamination region of the opposite electrode 54 and the metal oxide 56 becomes a measurable measurement region 76. Furthermore, the charging and discharging characteristics are measured in a charging layer measurement region 78 in the subject to be measured 60 which corresponds to the measurement region 76.

The source of voltage 62, the voltmeter 66 and the load resistance 68 are connected in parallel to the electrode (not illustrated) provided in the elastomer 74 and the base electrode 14 in the subject to be measured 60. Furthermore, a switch 80 is provided in series with the source of voltage 62 to block the source of voltage 62 after the charging layer 18 is charged.

As illustrated in FIG. 11, the base electrode 14 is formed across a wider region than the charging layer 18 on a substrate surface for wire connection. The charging layer measurement region 78 in the charging layer 18 is charged using the source of voltage 62, then, a switch 80 is turned off, and the voltage in the load resistance 68 is measured using the voltmeter together with the elapsed time. When the subject to be measured 60 is measured using the charging and discharging characteristic-testing device, the relationship between the discharging voltage with respect to a load resistance 66 and the elapsed time is obtained.

Figure 12:
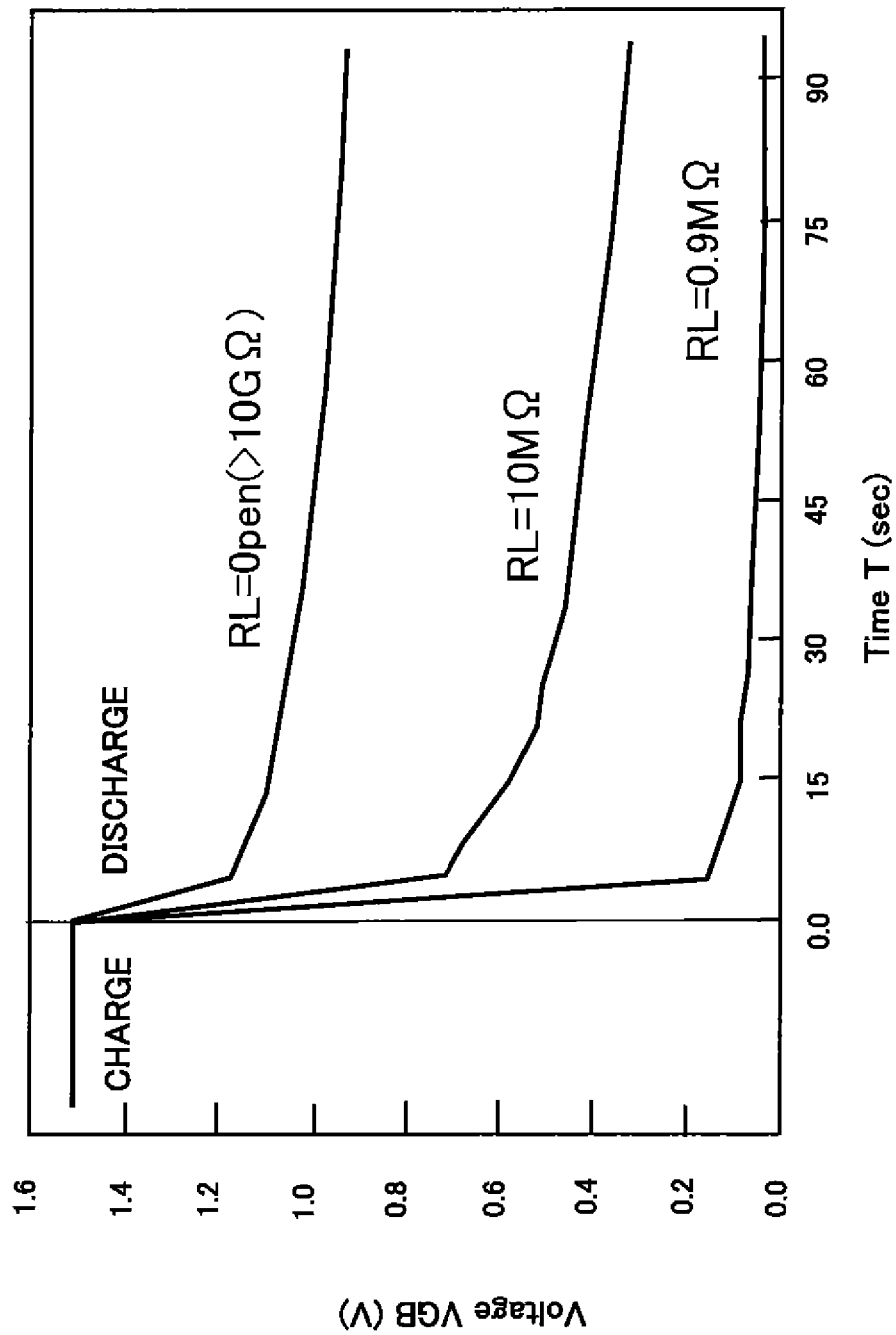
FIG. 12 is a view illustrating the measurement results of the charging and discharging characteristics of the charging layer.

FIG. 12 illustrates the results of the values of voltage varying with the elapsed time obtained while monitoring the voltage in the voltmeter 66 in a case in which the charging layer 18 is charged to 1.5 V using the source of voltage 62, then, the switch 80 is turned off, and the load resistance RL is set to open (10 GΩ or more), 10 MΩ and 0.9 MΩ. The X axis indicates the elapsed time (sec), and the Y axis indicates the voltage value (V). From the results, it could be confirmed that the quantum battery exhibited discharging characteristics as a secondary battery.

Thus far, the embodiment of the invention has been described, and the invention can be modified as appropriate as long as the object and advantages of the invention are not impaired, and furthermore, the invention is not limited to the embodiment.

REFERENCE SIGNS LIST

10 quantum battery
12 substrate
14 base electrode
16 n-type metal oxide semiconductor layer 18 charging layer
20 p-type metal oxide semiconductor layer
22 opposite electrode
26 n-type metal oxide semiconductor
28 insulating film
30 electrode
32 intermediate crystal layer
34 n-type metal oxide semiconductor layer
36 conduction band
38 valence band
40 fermi level
42 ultraviolet ray
44 electron
46 hole
48 energy level
50 semiconductor probe
52 support
54 electrode
56 metal oxide semiconductor
58 charging-corresponding region
60 subject to be measured
62 source of voltage
64 ammeter
66 voltmeter
68 load resistance
74 elastomer
76 measurement region
78 charging layer measurement region
80 switch
82 pet film

The invention claimed is:

1. A semiconductor probe comprising:
a support;
a conductive electrode laminated on the support; and
a metal oxide semiconductor layer made of a metal oxide semiconductor laminated on the conductive electrode,
wherein:
the semiconductor probe is configured to be brought into contact with a surface of a charging layer of a secondary battery during production of the secondary battery to evaluate current-voltage and charge-discharge characteristics of the charging layer of the secondary battery in production; and
a secondary battery construction is formed by contacting the semiconductor probe to the surface of the charging layer of the secondary battery.

2. The semiconductor probe according to claim 1, wherein the metal oxide semiconductor is a p-type semiconductor.

3. The semiconductor probe according to claim 2, wherein the p-type semiconductor is nickel oxide or copper aluminum oxide.

4. The semiconductor probe according to claim 1, wherein the metal oxide semiconductor is an n-type semiconductor.

5. The semiconductor probe according to claim 4, wherein the charging layer of the secondary battery is laminated on an electrode through a p-type semiconductor.

6. The semiconductor probe according to claim 4, wherein the n-type metal oxide semiconductor is selected from the group consisting of titanium dioxide, tin oxide, and zinc oxide.

7. The semiconductor probe according to claim 1, wherein in order to trap electrons, the charging layer forms an energy level in a band gap through a photo-excited structural change caused by irradiating an ultraviolet ray on an n-type metal oxide semiconductor coated with an insulating substance.

8. The semiconductor probe according to claim 1, wherein the support is an elastic body.

9. The semiconductor probe according to claim 1, wherein the support includes an elastic body in a part.

10. The semiconductor probe according to claim 8, wherein the elastic body is an elastomer.

11. The semiconductor probe according to claim 10, wherein the support is provided with a plurality of the independent electrodes and the independent metal oxide semiconductor layers.

12. An electrical characteristic-testing device for a charging layer using a semiconductor probe, comprising:
the semiconductor probe configured by laminating a conductive electrode and a metal oxide semiconductor layer made of a metal oxide semiconductor on a support;
a source of voltage that applies voltage between the electrode provided in the semiconductor probe and a base electrode on which the charging layer for a secondary battery is laminated; and
an ammeter that measures a current flowing between the electrode provided in the semiconductor probe and the base electrode on which the charging layer is laminated, wherein current-voltage characteristics of the charging layer are measured.

13. An electrical characteristic-testing method for a charging layer using a semiconductor probe,
wherein the current-voltage characteristics of a charging layer are measured using
the semiconductor probe configured by laminating on a support
a conductive electrode and
a metal oxide semiconductor layer made of a metal oxide semiconductor;
a source of voltage that applies voltage between the electrode provided in the semiconductor probe and a base electrode on which the charging layer for a secondary battery is laminated; and
an ammeter that measures a current flowing between the electrode provided in the semiconductor probe and the base electrode on which the charging layer is laminated.

14. A charging and discharging characteristic-testing device for a charging layer using a semiconductor probe, comprising:
the semiconductor probe configured by laminating a conductive electrode and a metal oxide semiconductor layer made of a metal oxide semiconductor on a support;
a source of voltage that applies voltage between the electrode provided in the semiconductor probe and a base electrode on which a charging layer for a secondary battery is laminated so as to charge the charging layer;
a load resistance connected in parallel to the source of voltage; and
a voltmeter that measures a voltage at the load resistance
wherein the charging layer is charged, then, the source of voltage is blocked so as to make a current from the charging layer flow into the load resistance, and voltage at the load resistance is measured, thereby measuring charging and discharging characteristics of the charging layer as battery characteristics.

15. A charging and discharging characteristic-testing method for a charging layer using a semiconductor probe,
wherein the charging layer is charged, then, the source of voltage is blocked so as to make a current from the charging layer flow into the load resistance, and voltage at the load resistance is measured, thereby measuring charging and discharging characteristics of the charging layer as battery characteristics using the semiconductor probe configured by laminating a conductive electrode and a metal oxide semiconductor layer made of a metal oxide semiconductor on a support, a source of voltage that applies voltage between the electrode provided in the semiconductor probe and a base electrode on which a charging layer for a secondary battery is laminated so as to charge the charging layer;

a load resistance connected in parallel to the source of voltage; and a voltmeter that measures a voltage at the load resistance.

16. The electrical characteristic-testing device for a charging layer using a semiconductor probe according to claim 12,
wherein a plurality of the electrodes and the metal oxide semiconductor layers are formed on the support, and
current-voltage characteristics of the charging layer are measured at a plurality of local regions.

17. The electrical characteristic-testing method for a charging layer using a semiconductor probe according to claim 13,
wherein the current-voltage characteristics of the charging layer are measured at a plurality of local regions using the semiconductor probe having a plurality of the electrodes and the metal oxide semiconductor layers formed on the support.

18. The charging and discharging characteristic-testing device for a charging layer using a semiconductor probe according to claim 14,
wherein a plurality of the electrodes and the metal oxide semiconductor layers are formed on the support, and
charging and discharging characteristics of the charging layer are measured at a plurality of local regions.

19. The charging and discharging characteristic-testing method for a charging layer using a semiconductor probe according to claim 15,
wherein the charging and discharging characteristics of the charging layer are measured at a plurality of local regions using the semiconductor probe having a plurality of the electrodes and the metal oxide semiconductor layers formed on the support.

20. The semiconductor probe according to claim 9, wherein the elastic body is an elastomer.

* * * * *